(12) United States Patent
Liu et al.

(10) Patent No.: US 9,954,012 B2
(45) Date of Patent: Apr. 24, 2018

(54) DISPLAY DEVICE

(71) Applicants: BOE TECHNOLOGY GROUP CO., LTD., Beijing (CN); HEFEI XINSHENG OPTOELECTRONICS TECHNOLOGY CO., LTD, Hefei, Anhui (CN)

(72) Inventors: Liping Liu, Beijing (CN); Chunlei Dong, Beijing (CN)

(73) Assignees: BOE TECHNOLOGY GROUP CO., LTD. (CN); HEFEI XINSHENG OPTOELECTRONICS TECHNOLOGY CO., LTD. (CN)

( * ) Notice: Subject to any disclaimer, the term of this patent is extended or adjusted under 35 U.S.C. 154(b) by 36 days.

(21) Appl. No.: 14/769,196

(22) PCT Filed: Feb. 27, 2015

(86) PCT No.: PCT/CN2015/073345
§ 371 (c)(1),
(2) Date: Aug. 20, 2015

(87) PCT Pub. No.: WO2016/074375
PCT Pub. Date: May 19, 2016

(65) Prior Publication Data
US 2016/0343741 A1 Nov. 24, 2016

(30) Foreign Application Priority Data
Nov. 13, 2014 (CN) .......................... 2014 1 0640405

(51) Int. Cl.
H01L 27/12 (2006.01)
G02F 1/1341 (2006.01)
(Continued)

(52) U.S. Cl.
CPC ........ *H01L 27/1244* (2013.01); *G02F 1/1341* (2013.01); *G02F 1/13452* (2013.01);
(Continued)

(58) Field of Classification Search
CPC combination set(s) only.
See application file for complete search history.

(56) References Cited

U.S. PATENT DOCUMENTS

2004/0075801 A1* 4/2004 Choi ..................... G02F 1/1339
349/153
2005/0243236 A1 11/2005 Sumi
(Continued)

FOREIGN PATENT DOCUMENTS

CN 101359108 A 2/2009
CN 101676776 A 3/2010
(Continued)

OTHER PUBLICATIONS

Office Action in Korean Patent Application No. 10-2015-7023322, dated Jul. 19, 2019.
(Continued)

*Primary Examiner* — Ratisha Mehta
(74) *Attorney, Agent, or Firm* — Brooks Kushman P.C.

(57) ABSTRACT

A display device is disclosed and includes an array substrate and a color filter substrate. The color filter substrate includes a display region, a peripheral black matrix region and a process reserved blank region which are sequentially arranged from inside to outside. A bonding line is provided within the peripheral black matrix region and/or the process reserved blank region and electrically connected to a structure to be bonded on the array substrate through a connection structure.

16 Claims, 2 Drawing Sheets

(51) Int. Cl.
*G02F 1/1345* (2006.01)
*G02F 1/1362* (2006.01)
*G09G 3/36* (2006.01)
*G02F 1/1335* (2006.01)

(52) U.S. Cl.
CPC .. *G02F 1/133512* (2013.01); *G02F 1/136209* (2013.01); *G02F 1/136286* (2013.01); *G09G 3/3655* (2013.01); *G02F 2001/136222* (2013.01)

(56) References Cited

U.S. PATENT DOCUMENTS

| | | | |
|---|---|---|---|
| 2007/0120152 A1* | 5/2007 | Chang | G02F 1/133345 257/270 |
| 2010/0033646 A1* | 2/2010 | Baek | G02F 1/136209 349/42 |
| 2012/0257132 A1 | 10/2012 | Kitajima et al. | |
| 2013/0120231 A1* | 5/2013 | Jo | G02F 1/13452 345/98 |
| 2014/0353619 A1* | 12/2014 | Park | H01L 27/3276 257/40 |

FOREIGN PATENT DOCUMENTS

| | | |
|---|---|---|
| CN | 101957522 A | 1/2011 |
| CN | 201909918 U | 7/2011 |
| CN | 102193236 A | 9/2011 |
| CN | 103116233 A | 5/2013 |
| CN | 103293736 A | 9/2013 |
| CN | 103293750 A | 9/2013 |
| CN | 103885221 A | 6/2014 |
| CN | 104317125 A | 1/2015 |
| CN | 204203593 U | 3/2015 |
| JP | 2002-049034 A | 2/2002 |
| KR | 10-2001-0062415 A | 7/2001 |
| KR | 10-2007-0005236 A | 1/2007 |

OTHER PUBLICATIONS

Office Action in Chinese Patent Application No. 201410640405.1, dated Aug. 3, 2016.

International Search Report and Written Opinion in PCT International Application No. PCT/CN2015/073345, dated Jul. 1, 2015.

* cited by examiner

US 9,954,012 B2

DISPLAY DEVICE

CROSS-REFERENCE TO RELATED APPLICATIONS

The present application is the U.S. National Phase of PCT Application No. PCT/CN2015/073345 filed on Feb. 27, 2015, which claims the priority of Chinese patent application No. 201410640405.1 filed on Nov. 13, 2014, the disclosure of which is incorporated herein by reference.

TECHNICAL FIELD

The present disclosure relates to the field of display technology, in particular to a display device.

BACKGROUND

A liquid crystal display device is a flat, super-thin display device, which has advantages such as being of small volume, small thickness, light weight, low energy consumption and low radiation. The liquid crystal display device includes a color filter substrate and an array substrate. The color filter substrate may include a display region, a peripheral black matrix region and a process reserved blank region. The array substrate may include a display region and a peripheral wiring region.

To be specific, in the display region of the array substrate, structures such as gate lines, data lines, thin film transistors (TFTs) and pixel electrodes are provided. In the peripheral wiring region, data line bonding lines and gate line bonding lines are provided. The data line bonding line is configured to transmit a data signal outputted by a source driving circuit to the data line and the gate line bonding line is configured to transmit a gate driving signal outputted by a gate driving circuit to the gate line so as to drive structures such as TFTs and the pixel electrodes within the display region to work, thereby to enable the display region to display images.

Inventors found that in the related art, in order to make the liquid crystal display (LCD) display have a high resolution, a large number of gate lines and data lines are provided in the display region of the array substrate, which makes a layout of the lines in the peripheral wiring region be complex and a space occupied by the lines large. As a result, a size of the array substrate is larger than that of the color filter substrate, and then the LCD display including the array substrate and the color filter substrate has a wider bezel.

SUMMARY

An object of the present disclosure is to provide a display device having a narrower bezel.

In one aspect, the present disclosure provides in one embodiment a display device, including an array substrate and a color filter substrate. The color filter substrate includes a display region, a peripheral black matrix region and a process reserved blank region which are sequentially arranged from inside to outside. A bonding line is provided within the peripheral black matrix region and/or the process reserved blank region and electrically connected to a structure to be bonded on the array substrate through a connection structure.

Alternatively, the display region is provided with a common electrode, the bonding line and the common electrode are of an identical material and arranged in an identical layer.

Alternatively, the material of the common electrode is indium tin oxide.

Alternatively, the display device further includes a sealant which makes the array substrate adhere to the color filter substrate. The sealant contains metal balls used as the connection structure, and the connection structure contains at least one metal ball at a position corresponding to each bonding line.

Alternatively, the connection structure includes one metal ball at a position corresponding to each bonding line.

Alternatively, the metal balls each has a diameter of 2-5 µm.

Alternatively, the structure to be bonded is provided with a conductive pad, a material of the conductive pad is indium tin oxide, the connection structure is electrically connected to the structure to be bonded through the conductive pad.

Alternatively, the structure to be bonded includes a gate line and a data line, the bonding line includes a gate line bonding line and a data line bonding line; or the structure to be bonded includes a gate line, the bonding line includes a gate line bonding line; or the structure to be bonded includes a data line, the bonding line includes a data line bonding line.

Alternatively, the conductive pad includes a gate line conductive pad and/or a data line conductive pad. The gate line conductive pad is electrically connected to the gate line via a first via hole in a gate insulation layer arranged on the gate line, and the data line conductive pad is electrically connected to the data line via a second via hole in a passivation layer arranged on the data line.

Alternatively, the gate line conductive pad arranged on the first via hole and the data line conductive pad arranged on the second via hole are each provided with a groove.

Alternatively, the display device further includes a flexible circuit board and a printed circuit board, the bonding line is electrically connected to a driving circuit on the printed circuit board through the flexible circuit board.

Alternatively, the flexible circuit board includes: a first connecting finger arranged on one surface of the flexible circuit board and a second connecting finger arranged on the other surface of the flexible circuit board. The first connecting finger is electrically connected to the bonding line, and the second connecting finger is electrically connected to the driving circuit on the printed circuit board.

Alternatively, the flexible circuit board includes a first connecting finger and a second connecting finger which are arranged respectively on two ends of a same surface of the flexible circuit board; and the flexible circuit board is bent so that the first connecting finger is electrically connected to the driving circuit on the printed circuit board and the second connecting finger is electrically connected to the bonding line.

Alternatively, one end of the bonding line is electrically connected to the driving circuit of the printed circuit board through the flexible circuit board, and the other end of the bonding line is electrically connected to the structure to be bonded through the connection structure.

The present disclosure provides a display device. The display device includes an array substrate and a color filter substrate. The color filter substrate includes a display region, a peripheral black matrix region and a process reserved blank region which are sequentially arranged from inside to outside. A bonding line is provided within the peripheral black matrix region and/or the process reserved blank region and electrically connected to a structure to be bonded on the array substrate through a connection structure. Therefore, the existing regions on the color filter substrate are fully used, thereby avoiding arrangement of the bonding line on the array substrate, so as to enable the display device to have a narrow bezel.

BRIEF DESCRIPTION OF THE DRAWINGS

In order to more clearly illustrate the technical solutions according to the embodiments of the present disclosure or the related art, accompany drawings acquired to use in the description of the embodiments will be described briefly below. It is obvious that, the described drawings are merely parts of embodiments of the present disclosure, and other drawings can also be obtained according to these drawings for a person skilled in the art without creative work.

DETAILED DESCRIPTION

In order to make the objects, technical solutions and advantages of the embodiments of the present disclosure more clear, the technical solutions according to the embodiments of the present disclosure will be clearly and fully described hereinafter in conjunction with the accompanying drawings in the embodiments of the present disclosure. Obviously, the described embodiments are merely parts of embodiments of the present disclosure, but not all the embodiments. Based on the embodiments in the present disclosure, all the other embodiments obtained by a person skilled in the art will fall within the protection scope of the present disclosure.

The present disclosure provides a display device which has a narrow bezel.

Figure 1:
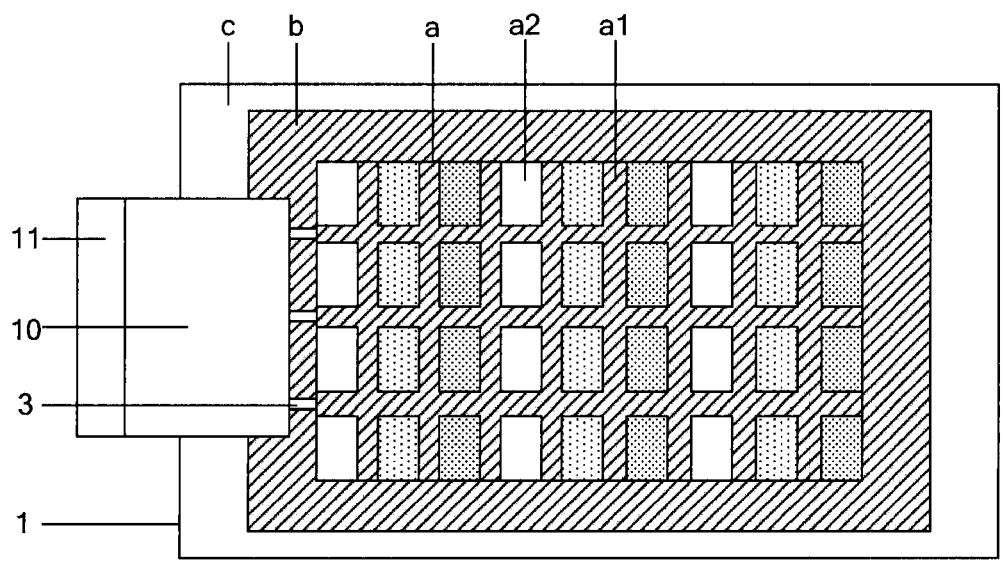
FIG. 1 is a schematic plan view showing a color filter substrate in a display device according to one embodiment of the present disclosure.
Figure 2:
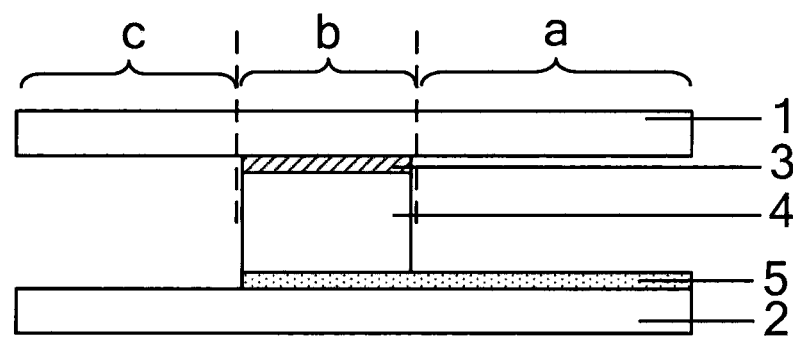
FIG. 2 is a schematic partial cross-sectional view of the display device according to one embodiment of the present disclosure.

To be specific, the display device includes a color filter substrate and an array substrate. As shown in FIG. 1, the color filter substrate 1 includes a display region a, a peripheral black matrix region b and a process reserved blank region c, which are arranged sequentially from inside to outside. A bonding line 3 is provided within the peripheral black matrix region b and/or the process reserved blank region c. As shown in FIG. 2, the bonding line 3 is electrically connected to a structure to be bonded 5 on the array substrate 2 through a connection structure 4. To be specific, one end of the bonding line 3 is electrically connected to the driving circuit, and the other end of the bonding line 3 is electrically connected to the structure to be bonded 5 through the connection structure 4 so as to transmit a drive signal outputted by the driving circuit to the structure to be bonded 5. The connection structure 4 may be a metal ball in sealant or a conductive structure such as a conductive adhesive.

It should be noted that, as shown in FIG. 1, the color filter substrate 1 generally further includes structures such as a black matrix a1 and a color filter layer a2 in the display region a, so as to achieve a color display of the display device. A peripheral black matrix is provided within the peripheral black matrix region b so as to prevent light leakage from an edge of the display device. In one embodiment of the present disclosure, the peripheral black matrix and the black matrix a1 in the display region a may be of an identical material and formed simultaneously. The process reserved blank region c is used to prevent the structures such as the black matrix a1 and the color filter layer a2 in the display region a on the color filter substrate 1 from being damaged during a cutting process when forming a liquid crystal cell. As shown in FIG. 1, the bonding line 3 may be arranged in the peripheral black matrix region b. When a size of the bonding line 3 excesses a size of the peripheral black matrix region b, the bonding line 3 can be extended to the process reserved blank region c, so as to prevent the bonding line 3 from being damaged during the cutting process when forming the liquid crystal cell.

For example, the display region a may be provided with a transparent conductive common electrode. The common electrode is arranged on the black matrix a1 and the color filter layer a2. In order to simplify the manufacturing process of the color filter substrate 1, in one embodiment of the present disclosure, the bonding line 3 and the common electrode may be of an identical material and arranged in an identical layer. For example, the material of the common electrode may be indium tin oxide (ITO).

Figure 3:
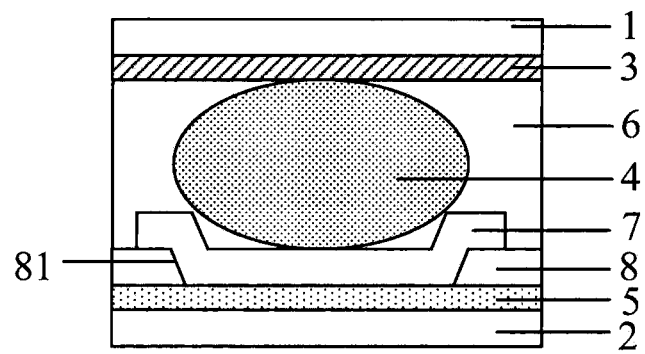
FIG. 3 is a schematic cross-sectional view of the display device at a position of a gate line according to one embodiment of the present disclosure.
Figure 4:
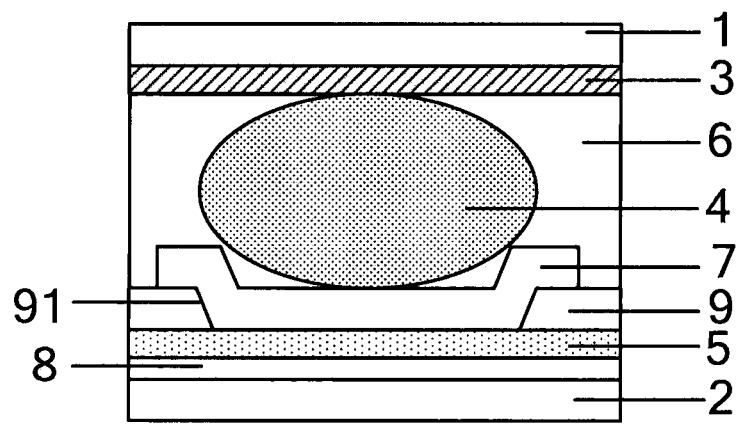
FIG. 4 is a schematic cross-sectional view of the display device at a position of a data line according to one embodiment of the present disclosure.

As shown in FIG. 3 and FIG. 4, the display device may further include a sealant 6 which is configured to make the color filter substrate 1 adhere to the array substrate 2. The sealant 6 contains a metal ball which is used as the connection structure 4, and the connection structure contains at least one metal ball at a position corresponding to each bonding line 3. In one embodiment, the metal ball(s) in the sealant 6 may be mixed into the sealant 6 through the following way: placing a certain amount of metal balls into a sealant 6 which is in a sticky state; stirring for a certain period of time at a certain speed and at a suitable temperature, so that a sealant 6 in a sticky state and containing metal balls can be obtained; then coating the sealant 6 in the sticky state onto a peripheral region of the array substrate 2 or the color filter substrate 1; curing the sealant 6 by UV irradiation, so that the sealant 6 in which the metal balls are uniformly distributed is obtained. No metal ball is in contact with each other. When the connection structure 4 includes one metal ball, since a distance between the color filter substrate 1 and the array substrate 2 usually is 2-5 μm, thus the metal ball in one embodiment has a diameter of, for example, 2-5 μm. At this point, there is only one conductive path between the structure to be bonded 5 and the bonding line 3. It is also available that, by adjusting a density of the metal balls in the sealant 6, a plurality of metal balls may be arranged between the structure to be bonded 5 and the bonding structure 3, so that there is a plurality of conductive paths between the structure to be bonded 5 and the bonding line 3. However, metal balls in the sealant 6 must be in no contact with each other, so as to avoid connection of two adjacent bonding lines 3 or two adjacent structures to be bonded 5.

In one embodiment, the structure to be bonded 5 on the array substrate 2 may include a gate line and/or a data line, a material of which is usually metal. Since oxidation resistance of metal is poor, thus, as shown in FIG. 3 and FIG. 4, in one embodiment of the present disclosure, the structure to be bonded 5 may be provided with a conductive pad 7. The conductive pad 7 is of a material of indium tin oxide (ITO). At this point, the connection structure 4 is electrically connected to the structure to be bonded 5 through the conductive pad 7.

To be specific, the structure to be bonded 5 may include a gate line and a data line; correspondingly, the bonding line 3 includes a gate line bonding line and a data line bonding line. The structure to be bonded 5 may also include a gate line; correspondingly, the bonding line 3 includes a gate line bonding line. The structure to be bonded 5 may further include a data line; correspondingly, the bonding line 3 includes a data line bonding line. For example, when the gate driving circuit is directly manufactured on the array substrate 2, it is only needed to bond the data line. At this point, the structure to be bonded 5 includes the data line, and the bonding line 3 includes the data line bonding line.

Further, the conductive pad 7 may include a gate line conductive pad and/or a data line conductive pad. As shown in FIG. 3, the structure to be bonded 5 is a gate line, and the bonding line 3 is a gate line bonding line. The conductive pad 7 is a gate line conductive pad, and electrically connected to the gate line via a first via hole 81 in a gate insulation layer 8 arranged on the gate line. As shown in FIG. 4, the structure to be bonded 5 is a data line, and the bonding line 3 is a data line bonding line. The conductive pad 7 is a data line conductive pad, and electrically connected to the data line via a second via hole 91 in a passivation layer 9 arranged on the data line. It can be known from the above that, on the array substrate 2, it is needed to form the gate insulation layer 8 and the first via hole 81 firstly, and then to form the gate line conductive pad. Therefore, as shown in FIG. 3, the gate line conductive pad arranged on the first via hole 81 is provided with a groove. Similarly, as shown in FIG. 4, the data line conductive pad arranged on the second via hole 91 is also provided with a groove. When the connection structure 4 includes the metal ball, the groove helps to fix the metal ball, so as to further ensure an electrical connection between the gate line on the array substrate 2 and the gate line bonding line on the color filter substrate 1 at a position right corresponding to the gate line, and an electrical connection between the data line on the array substrate 2 and the data line bonding line on the color filter substrate 1 at a position right corresponding to the data line.

Further, as shown in FIG. 1, the display device further includes a flexible circuit board 10 and a printed circuit board 11. The bonding line 3 is electrically connected to a driving circuit on the printed circuit board 11 through the flexible circuit board 10. To be specific, one end of the bonding line 3 is electrically connected to the driving circuit of the printed circuit board 11 through the flexible circuit board 10, and as shown in FIG. 2, the other end of the bonding line 3 is electrically connected to the structure to be bonded 5 through the connection structure 4, so as to enable to transmit a drive signal outputted by the driving circuit on the printed circuit board 11 to the structure to be bonded 5.

For example, in one embodiment of the present disclosure, the electrical connection between the bonding line 3 and the driving circuit of the printed circuit board 11 may achieve through the flexible circuit board 10 which has one of the following two structures.

First structure: the flexible circuit board 10 includes a first connecting finger and a second connecting finger, which are arranged on two ends of a same surface of the flexible circuit board 10; the flexible circuit board 10 is bent so that the first connecting finger is electrically connected to the driving circuit on the printed circuit board 11 and the second connecting finger is electrically connected to the bonding line 3, thereby achieving the electrical connection between the bonding line 3 and the driving circuit of the printed circuit board 11.

Second structure: the flexible circuit board 10 includes a first connecting finger arranged on one surface of the flexible circuit board 10 and a second connecting finger arranged on the other surface of the flexible circuit board 10; the first connecting finger is electrically connected to the bonding line 3, and the second connecting finger is electrically connected to the driving circuit on the printed circuit board 11; at this point, the electrical connection between the bonding line 3 and the driving circuit of the printed circuit board 11 can be achieved without bending the flexible circuit board 10; as a result, an assembly of the display device is convenient and a space can be saved.

The present disclosure provides in one embodiment a display device. The display device includes an array substrate and a color filter substrate. The color filter substrate includes a display region, a peripheral black matrix region and a process reserved blank region which are sequentially arranged from inside to outside. A bonding line is provided within the peripheral black matrix region and/or the process reserved blank region and electrically connected to a structure to be bonded on the array substrate through a connection structure. Therefore, the existing regions on the color filter substrate are fully used, thereby avoiding arrangement of the bonding line on the array substrate, so as to enable the display device to have a narrow bezel.

The above are merely the embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure. Therefore, the protection scope of the present disclosure shall be defined by the claims.

What is claimed is:

1. A display device, comprising an array substrate and a color filter substrate; wherein the color filter substrate comprises a display region, a peripheral black matrix region and a process reserved blank region which are sequentially arranged from inside to outside;
   wherein the color filter substrate comprises a bonding line within the peripheral black matrix region and/or the process reserved blank region; the bonding line is electrically connected to a structure to be bonded on the array substrate through a connection structure;
   wherein the display region is provided with a common electrode; the bonding line and the common electrode are of an identical material and arranged in an identical layer.

2. The display device according to claim 1, wherein the material of the common electrode is indium tin oxide.

3. The display device according to claim 1, further comprising a sealant which makes the array substrate adhere to the color filter substrate;
   wherein the sealant contains metal balls used as the connection structure, and the connection structure contains at least one metal ball at a position corresponding to each bonding line.

4. The display device according to claim 3, wherein the metal balls each has a diameter of 2-5 μm.

5. The display device according to claim 3, wherein the structure to be bonded is provided with a conductive pad; a material of the conductive pad is indium tin oxide; the connection structure is electrically connected to the structure to be bonded through the conductive pad.

6. The display device according to claim 5, wherein
the structure to be bonded comprises a gate line and a data line, the bonding line comprises a gate line bonding line and a data line bonding line; or
the structure to be bonded comprises a gate line, the bonding line comprises a gate line bonding line; or
the structure to be bonded comprises a data line, the bonding line comprises a data line bonding line.

7. The display device according to claim 6, wherein the conductive pad comprises a gate line conductive pad and/or a data line conductive pad; the gate line conductive pad is electrically connected to the gate line via a first via hole in a gate insulation layer arranged on the gate line; and the data line conductive pad is electrically connected to the data line via a second via hole in a passivation layer arranged on the data line.

8. The display device according to claim 7, wherein the gate line conductive pad arranged on the first via hole and the data line conductive pad arranged on the second via hole are each provided with a groove.

9. The display device according to claim 6, wherein the conductive pad comprises a gate line conductive pad; the gate line conductive pad is electrically connected to the gate line via a first via hole in a gate insulation layer arranged on the gate line.

10. The display device according to claim 6, wherein the conductive pad comprises a data line conductive pad; the data line conductive pad is electrically connected to the data line via a second via hole in a passivation layer arranged on the data line.

11. The display device according to claim 1, further comprising a flexible circuit board and a printed circuit board; wherein the bonding line is electrically connected to a driving circuit on the printed circuit board through the flexible circuit board.

12. The display device according to claim 11, wherein the flexible circuit board comprises a first connecting finger arranged on one surface of the flexible circuit board and a second connecting finger arranged on the other surface of the flexible circuit; the first connecting finger is electrically connected to the bonding line, and the second connecting finger is electrically connected to the driving circuit on the printed circuit board.

13. The display device according to claim 11, wherein the flexible circuit board comprises a first connecting finger and a second connecting finger which are arranged respectively on two ends of a same surface of the flexible circuit board; the flexible circuit board is bent so that the first connecting finger is electrically connected to the driving circuit on the printed circuit board and the second connecting finger is electrically connected to the bonding line.

14. The display device according to claim 11, wherein one end of the bonding line is electrically connected to the driving circuit of the printed circuit board through the flexible circuit board, and the other end of the bonding line is electrically connected to the structure to be bonded through the connection structure.

15. The display device according to claim 1, wherein the structure to be bonded comprises one of a gate line and a data line.

16. The display device according to claim 1, wherein there is a plurality of connection structures; the structure to be bonded comprises a gate line and a data line; and the bonding line comprises a gate line bonding line and a data line bonding line; the gate line bonding line is electrically connected to the gate line through one of the connection structures, and the data line bonding line is electrically connected to the data line through another one of the connection structures.

* * * * *